(12) United States Patent
Kim (10) Patent No.: US 8,130,540 B2
(45) Date of Patent: Mar. 6, 2012

(54) PHASE CHANGE RANDOM ACCESS MEMORY APPARATUS AND WRITE CONTROL METHOD FOR THE SAME

(75) Inventor: Dong Keun Kim, Ichon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 138 days.

(21) Appl. No.: 12/649,086

(22) Filed: Dec. 29, 2009

(65) Prior Publication Data

US 2011/0075474 A1  Mar. 31, 2011

(30) Foreign Application Priority Data

Sep. 29, 2009  (KR) .................. 10-2009-0092497

(51) Int. Cl.
*G11C 11/00* (2006.01)
(52) U.S. Cl. .................................. 365/163; 365/189.05
(58) Field of Classification Search ................. 365/163, 365/189.05
See application file for complete search history.

(56) References Cited

U.S. PATENT DOCUMENTS

| | | | |
|---|---|---|---|
| 6,961,277 B2 | 11/2005 | Moore et al. | |
| 7,511,984 B2 | 3/2009 | Liu | |
| 2005/0007852 A1 | 1/2005 | Moore et al. | |
| 2005/0276209 A1* | 12/2005 | Thornton et al. | 369/121 |
| 2006/0203542 A1* | 9/2006 | Kurotsuchi et al. | 365/163 |
| 2007/0184613 A1 | 8/2007 | Kim et al. | |
| 2009/0161419 A1 | 6/2009 | Park et al. | |
| 2009/0190401 A1 | 7/2009 | Jeon et al. | |

FOREIGN PATENT DOCUMENTS

KR  1020090066823 A  6/2009

* cited by examiner

*Primary Examiner* — Michael Tran
(74) *Attorney, Agent, or Firm* — William Park & Associates Ltd.

(57) ABSTRACT

The disclosed phase change random access memory apparatus is configured to program a predetermined phase change memory cell in the phase change memory apparatus in response to a plurality of write instructions applied at independent points of time.

12 Claims, 6 Drawing Sheets

PHASE CHANGE RANDOM ACCESS MEMORY APPARATUS AND WRITE CONTROL METHOD FOR THE SAME

CROSS-REFERENCES TO RELATED PATENT APPLICATION

The present application claims priority under 35 U.S.C 119(a) to Korean Application No. 10-2009-0092497, filed on Sep. 29, 2009, in the Korean Intellectual Property Office, which is incorporated herein by reference in its entirety as if set forth in full.

BACKGROUND

1. Technical Field

Various embodiments of the present disclosure generally relate to a semiconductor apparatus, in particular, a phase change random access memory apparatus and a write control method for the phase change random access memory apparatus.

2. Related Art

Phase change random access memory (PCRAM) apparatus is one of the nonvolatile memory apparatuses which is the next generation memory apparatuses that provides a high speed and enhanced number of re-writes in DRAM level performance. In particular, PCRAMs do not need to erase prior data before writing new data, and is capable of simultaneously performing a set and a reset operations.

Figure 1:
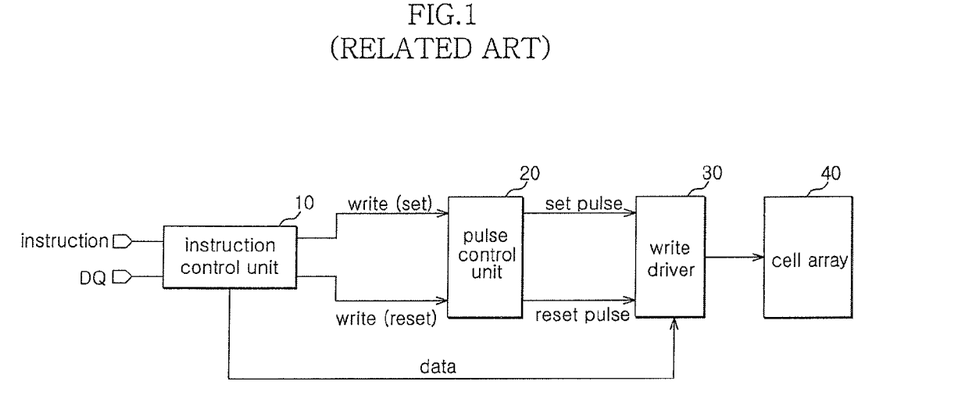
FIG. 1 is a diagram illustrating a write operation of a typical phase change random access memory apparatus.

FIG. 1 is a diagram illustrating a write operation of a typical phase change random access memory.

As a write instruction and data DQ through a data pad is inputted, an instruction control unit 10 simultaneously outputs a write command for a set operation and a write command for a reset operation.

A pulse control unit 20 generates and provides a pulse signal ($I_{S1}$ or $I_{S2}$ in FIG. 2) for a set operation and a pulse signal ($I_{RS}$ in FIG. 2) for a reset operation to a write driver 30, in response to the set write command and the reset write command.

In response to the data and input pulse signal generated by the instruction control unit 10, the write driver 30 writes set data or reset data in a corresponding memory cell in a cell array 40 in accordance with the voltage thereof.

As described above, a current PCRAM apparatus performs set/reset operations by simultaneously providing a write pulse for writing set data and a write pulse for writing reset data.

Figure 2:
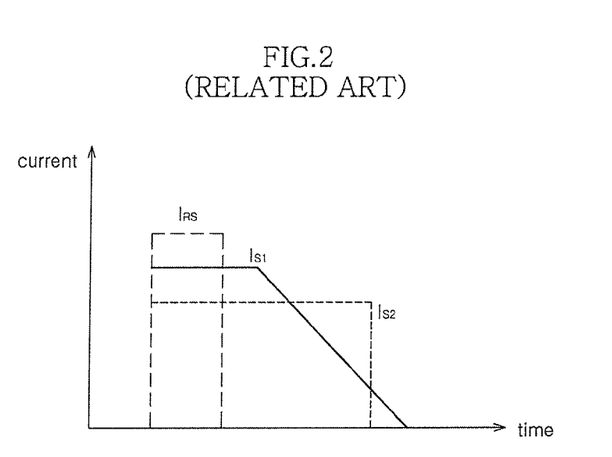
FIG. 2 is a diagram illustrating a current profile for a write operation in a typical phase change random access memory apparatus.

FIG. 2 is a diagram illustrating a current profile for a write operation in a typical phase change random access memory apparatus.

Writing reset data to the phase change random access memory apparatus requires a large amount of electric current to be applied for a short time which is shown as a first pulse $I_{RS}$ shown in FIG. 2. Meanwhile, writing set data requires a pulse having a slow quench wave such as a second pulse $I_{S1}$ shown in FIG. 2, or a rectangular wave such as a third pulse $I_{S2}$.

As described above, a large amount of electric current is required to program the cells of a phase change random access memory, and particularly, a large amount of programming time is required for the set data with a large amount of electric current.

Moreover, since more amount of electric current is needed to simultaneously program a plurality of cells, the electric current driving capability is limited considering the characteristics of PCRAMs that simultaneously write set/reset data.

In addition, since the set/reset data is simultaneously written, the state of the cell data may be deteriorated.

Further, as the set/reset operations are simultaneously performed in a contemporary PCRAM, the write operation period is determined based on the set operation which requires relatively long programming time since more time is required for the set operation than the reset operation. This in turn results in allotting unnecessarily long time to the reset operation which ultimately adversely affects the optimization of the operation speed.

Figure 3A:
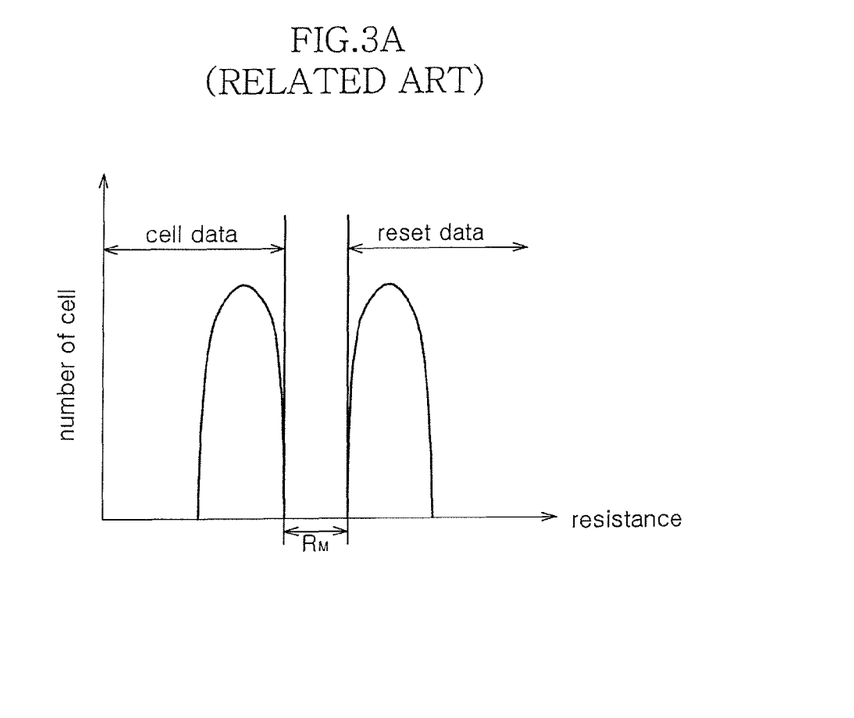
FIGS. 3A and 3B are diagrams illustrating resistance distribution in accordance with cell data in a phase change random access memory.
Figure 3B:
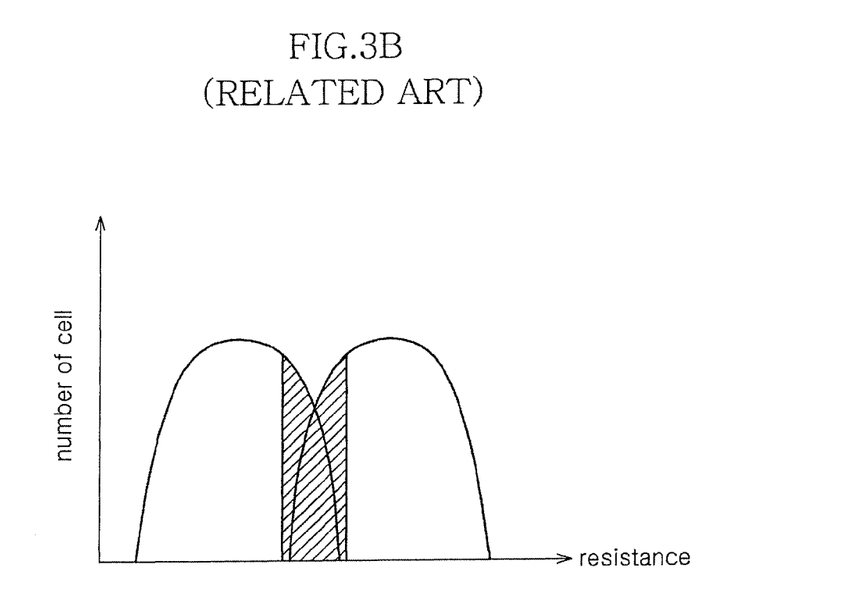

FIGS. 3A and 3B are diagrams illustrating the resistance distribution based on cell data in a cell within a phase change random access memory apparatus.

In the PCRAM, the phase change material in each cell is changed to a low resistance state to represent a set data whereas it is changed to a high resistance state to represent a reset data. Further, as shown in FIG. 3A, the resistance value of each cell has a normal distribution based on the number of cells. Here, it is ideal that there is a resistance difference $R_M$ bigger than a predetermined value between the resistance value of the phase change material representing the set data and the resistance value of the phase change material representing the reset data.

However, after a memory cell has been repeatedly written with data, and especially, set data and reset data have been simultaneously written, as shown in FIG. 3B, each of the state distributions of the cell data gradually spreads. If that happens, it is relatively hard to ensure the resistance difference between the phase change material storing the set data and the phase change material storing the reset data, such that unintended data may be stored in each memory cell.

On the other hand, the PCRAM is one of the good candidates to replace flash memories in the future as nonvolatile memories due to its high data processing speed as compared with flash memories in the related art. Here, the PCRAM does not need erasing operation which is different from the flash memories.

When a PCRAM apparatus is used in place of a flash memory apparatus, if an erasing instruction issues, the PCRAM apparatus simply stays in idle mode without performing the corresponding operation. Instead, when a programming command is generated, it simultaneously writes set data and reset data for a predetermined program period.

Figure 4:
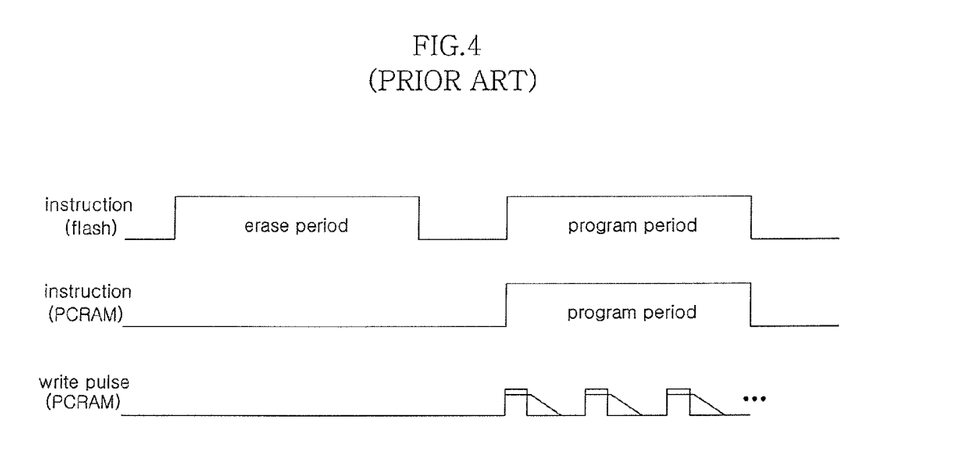
FIG. 4 is a diagram illustrating operational characteristics of a flash memory apparatus and a phase change random access memory apparatus, in accordance with a write command.

FIG. 4 is a diagram illustrating operational characteristics of a flash memory apparatus and a phase change random access memory apparatus, when they process a write command.

The flash memory performs erasing and programming in separate periods, in accordance with an erase command and a program command.

On the contrary, the PCRAM apparatus does not need an erase operation, and writes set data and a reset data in a single program period in response to a write instruction. Therefore, if the flash memory is replaced by the PCRAM, the PCRAM does not perform any operation during the period when the erase instruction is inputted. In contrast, it performs programming by applying a write pulse for simultaneously writing set/reset data in the period when a program instruction is inputted.

Further, it takes longer time to write set data than reset data. Accordingly, the number of programmable cells for a limited program period is necessarily limited and the erase period is inefficiently wasted.

SUMMARY

Accordingly, there is a need for an improved phase change random access memory apparatus and a related write control method that may overcome one or more of the problems discussed above. One aspect of the present invention provides a phase change random access memory apparatus that can minimize the time required for a programming operation, and a write control method for the phase change random access memory apparatus.

Another aspect of the present invention provides a phase change random access memory apparatus that can be easily applied to digital apparatuses using other nonvolatile memory apparatuses, and a write control method for the phase change random access memory apparatus.

To attain the advantages and in accordance with the purposes of the invention, as embodied and broadly described herein, a phase change random access memory apparatus according to a first embodiment of the present invention is configured to program a predetermined phase change memory cell in the phase change random access memory apparatus in response to a plurality of write instructions applied at independent points of time.

Further, a phase change random access memory apparatus according to a second embodiment of the present invention comprises: a write control unit configured to generate a first write pulse or a second write pulse in response to an instruction inputted from outside; and a write driver configured to write data in a predetermined phase change memory cell in the phase change random access memory apparatus in response to the first write pulse or the second write pulse.

Further, a phase change random access memory apparatus according to a third embodiment of the present invention comprises: an instruction-determining unit configured to generate one of a first write command enable signal and a second write command enable signal, and internal data, in response to one of a first instruction and a second instruction, which are inputted from outside, and external data; a pulse-generating unit configured to output a write pulse corresponding to a write command enable signal generated by the instruction-determining unit; and a write driver configured to write data by applying a current pulse corresponding to a write pulse, which is generated by the pulse-generating unit, to a predetermined phase change memory cell.

Further, a phase change random access memory apparatus according to a fourth embodiment of the present invention comprises a plurality of phase change memory cells, wherein the phase change random access memory apparatus is configured to change the logic level of data written in a predetermined memory cell, in response to an erase command.

Further, a nonvolatile memory apparatus according to a fifth embodiment of the present invention is a nonvolatile memory apparatus configured to perform an operation according to an erase command and a program command, wherein the nonvolatile memory apparatus is configured to perform a first write operation in response to the erase command and perform a second write operation in response to the program command.

On the other hand, a write control method of a phase change random access memory apparatus according to an embodiment of the present invention comprises: programming a predetermined phase change memory cell in the phase change random access memory apparatus in response to a first instruction; and programming a predetermined phase change memory cell in response to a second instruction.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

DETAILED DESCRIPTION

Reference will now be made in detail to the exemplary embodiments consistent with the present disclosure examples of which are illustrated in the accompanying drawings. Wherever possible, the same reference characters will be used throughout the drawings to refer to the same or like parts.

Figure 5:
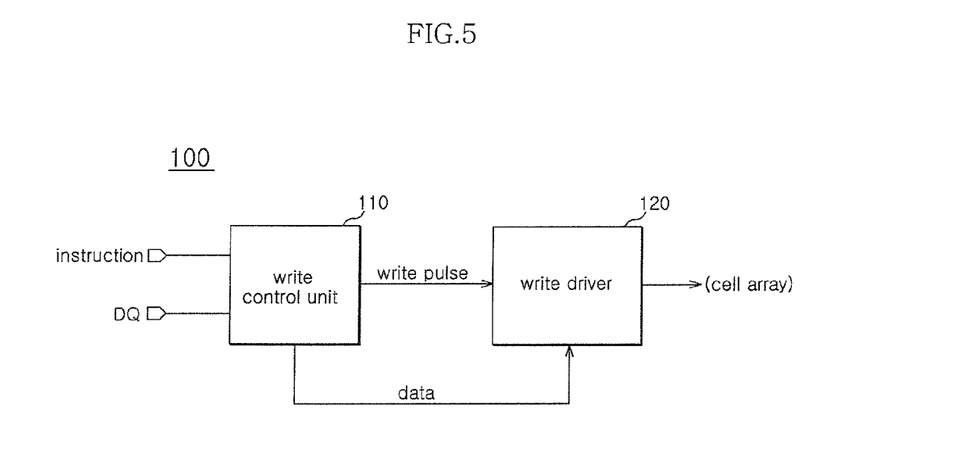
FIG. 5 is a diagram illustrating the configuration of a phase change random access memory apparatus according to an exemplary embodiment of the present invention.

FIG. 5 is a diagram illustrating the configuration of a phase change random access memory apparatus according to an exemplary embodiment of the present invention.

A phase change random access memory apparatus 100 according to the exemplary embodiment programs a predetermined memory cell included in a phase change memory cell array, in response to a plurality of write commands applied at independent points of time.

For this configuration, the phase change random access memory apparatus 100 includes a write control unit 110 that receives a plurality of write commands and external data DQ, which are applied at independent points of time, and outputs write pulses, which correspond to the write commands, and internal data, and a write driver 120 that receives the write pulses and internal data generated by the write control unit 110 and writes data in a predetermined cell.

Accordingly, for example, when writing data based on two logic levels, the phase change random access memory apparatus 100 according to the exemplary embodiment writes set or reset data in a predetermined phase change memory cell in response to a first instruction applied at a first point of time. Further, it writes reset or set data in a predetermined phase change memory cell in response to a second instruction applied at a second point of time, which is independent from the first point of time.

According to the preferred embodiment of the present invention, the second instruction applied at the second point of time is inputted after the write operation performed based on the first instruction applied at the first point of time is finished. That is, reset or set data is written by the second instruction after the operation of writing set or reset data by the first instruction is finished. Here, the operation of writing the reset data is not affected by the operation of writing the set data requiring relatively long time.

For example, the phase change random access memory apparatus 100 of the present invention can replace a flash memory, and in this case, the first instruction may be an erase command or a program command and the second instruction may be a program command or an erase command.

Therefore, when a typical phase change random access memory apparatus is used in place of a flash memory, the apparatus is in idle mode when an erase command is generated, but the phase change random access memory apparatus 100 according to the present invention writes set or reset data in a predetermined phase change memory cell in response to an erase command. Further, it writes different data (reset or set) from the data written by the erase command, when a program command is generated.

As a result, unlike the typical phase change random access memory apparatuses by which the write period is determined based on that of the set operation which needed a relatively long time, the set operation and the reset operation are independently performed by the phase change random access memory apparatus 100, such that the reset operation can be performed within a relatively short time.

Figure 6:
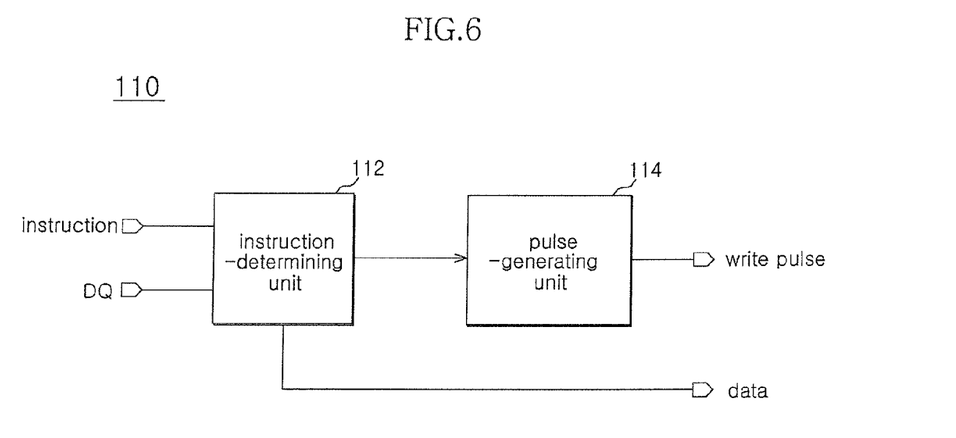
FIG. 6 is a diagram illustrating the configuration of the write control unit shown in FIG. 5.

FIG. 6 is a diagram illustrating the configuration of the write control unit shown in FIG. 5.

As shown in FIG. 6, the write control unit 110 includes a instruction-determining unit 112 that generates a first write command enable signal or a second write command enable signal together with internal data, in response to a first instruction or a second instruction and external data DQ inputted from outside, and a pulse-generating unit 114 that generates a corresponding write pulse in response to an output signal of the instruction-determining unit 112. In this configuration, the pulse-generating unit 114 outputs a first write pulse in response to the first instruction, or a second write pulse in response to the second instruction.

In an embodiment of the present invention, the instruction-determining unit 112 receives an erase command or a program command and, when an erase command is inputted, it generates a current pulse for the set or reset operation to the pulse-generating unit 114. Further, it generates a current pulse for the reset or set operation to the pulse-generating unit 114 at an independent point of time from the erase command, that is, preferably, when a program command is inputted after the set or reset operation according to the erase command is finished.

The profile of the current pulse for the set and reset operation, for example, can be generated in the format shown in FIG. 2, and this profile of the current pulse can be outputted by a typical pulse-generating unit.

As a write pulse is generated by the pulse-generating unit 114, the write driver 120 writes data in a predetermined phase change memory cell in response to the outputted write pulse.

Figure 7:
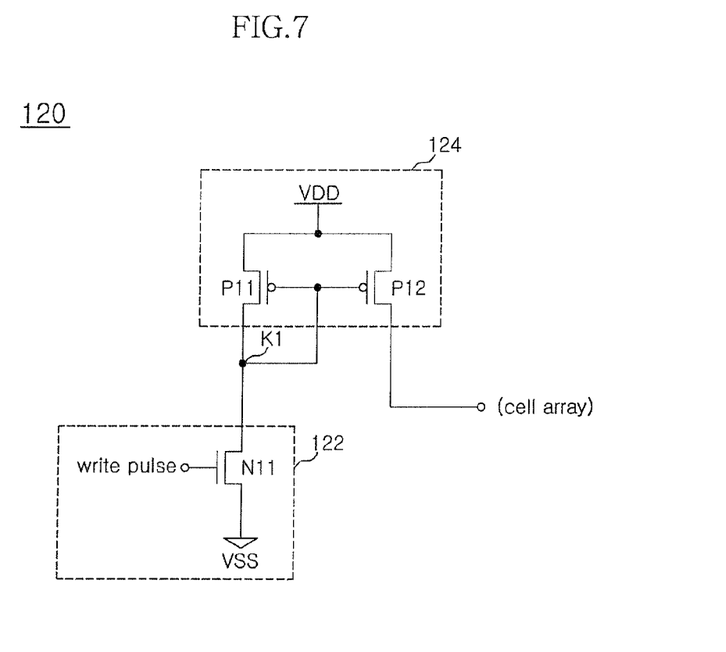
FIG. 7 is a circuit diagram of the write driver shown in FIG. 5.

FIG. 7 is a circuit diagram of the write driver shown in FIG. 5.

As shown in the figure, the write driver 120 includes a current control unit 122 that controls the amount of current that is applied to a first node K1 in response to a write pulse and an output control unit 124 that controls an output current value in accordance with the level of voltage applied to the first node K1.

More particularly, the current control unit 122 is connected between the first node K1 and a grounding terminal VSS and includes a first transistor N11 that is activated by a write pulse.

Meanwhile, the output control unit 124 includes a second transistor P11 that is connected between a power terminal VDD and the first node K1 and a third transistor P12 that is connected between the power terminal VDD and a memory cell array and activated by the potential applied to the first node K1.

In an embodiment of the present invention, the first transistor N11 may be an NMOS transistor, and the second and third transistors P11 and P12 may be PMOS transistors.

As a first write pulse according to a first command is generated by the pulse-generating unit 114, the potential of the first node K1 becomes a low level and a current pulse having the same profile as the first write pulse is generated by the output control unit 124. Further, when a second write pulse is generated by the pulse-generating unit 114 by a second instruction applied at an independent point of time from a first instruction, the voltage of the first node K1 becomes a low level, such that a current pulse having the same profile as the second write pulse is outputted.

Accordingly, it is possible to perform a programming operation while supplying a current pulse for writing set data or reset data in a desired format to a predetermined phase change memory cell array.

However, since the first instruction and the second instruction inputted to the instruction-determining unit 112 of the write control unit 110 are generated at independent points of time, it is possible to separately perform the set data programming operation and the reset data programming operation.

Typical phase memory random access memory apparatuses that simultaneously write set data and reset data, simultaneously generate a current pulse for writing set data and a current pulse for writing reset data. Therefore, current is controlled by separately receiving the set data write pulse and the reset data write pulse, thereby increasing the size of the circuit. According to the present invention however, since the set data write pulse and the reset data write pulse are independently received at different points of time, it is possible to control current with only one switching device, such that it is possible to reduce the entire size of the circuit.

On the other hand, in order to write data in a phase change memory cell, the data already written in a specific phase change memory cell may be the same as data to be written. It may be unnecessary to write data to the memory cell. Therefore, the present invention proposes the following method to prevent repeated data write.

Figure 8:
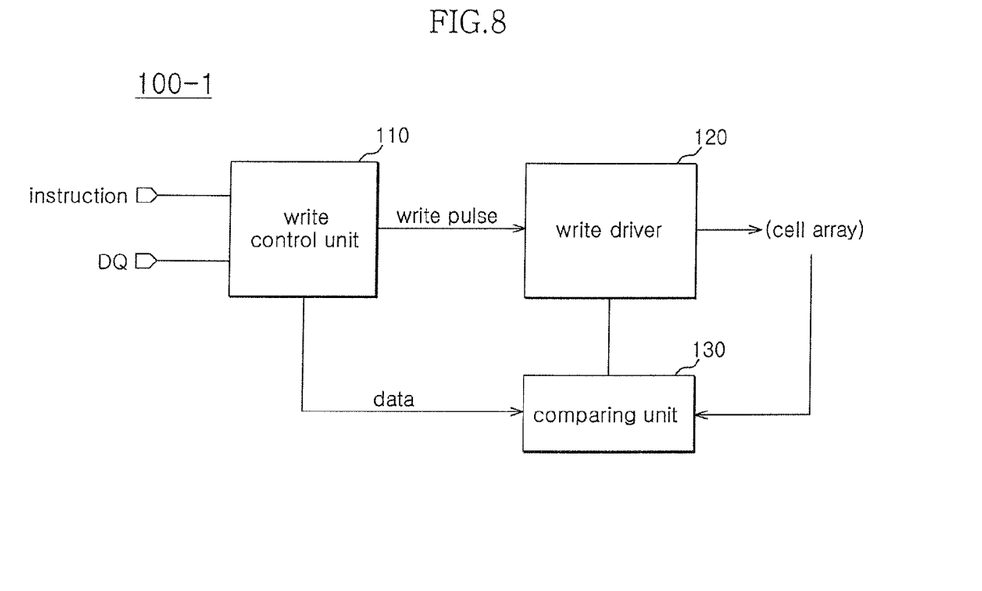
FIG. 8 is a diagram illustrating the configuration of a phase change random access memory apparatus according to another exemplary embodiment.

FIG. 8 is a diagram illustrating the configuration of a phase change random access memory apparatus according to another exemplary embodiment of the present invention.

In the present embodiment of the invention, a phase change random access memory apparatus 100-1 includes a comparing unit 130, in addition to the phase change random access memory apparatus 100 shown in FIG. 5.

The comparing unit 130 receives internal data generated by the write control unit 110 and data from each phase memory cell that will perform a write operation, and make the write driver 120 perform a programming operation, when both data is different.

Figure 9:
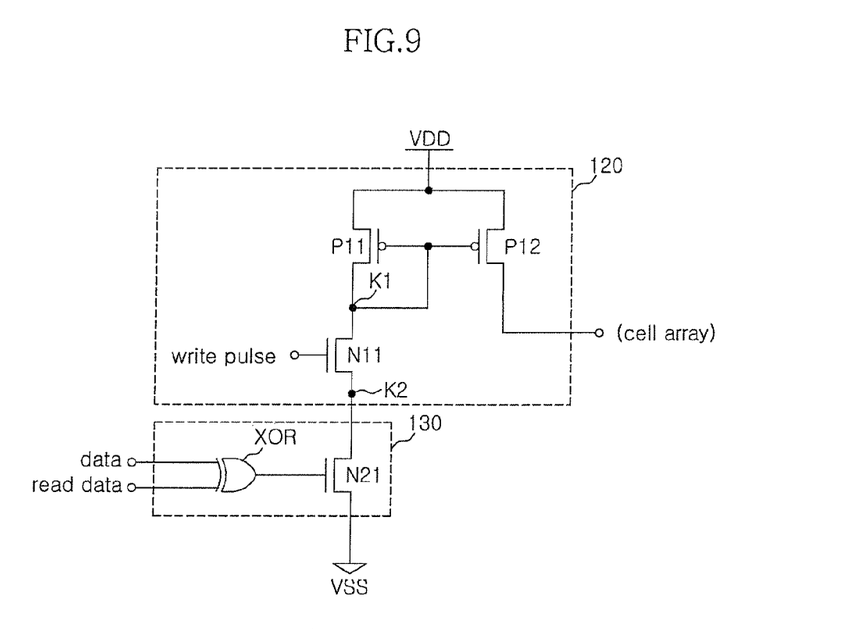
FIG. 9 is a circuit diagram of the write driver and a comparing unit shown in FIG. 8.

To achieve this operation, the write driver 120 and the comparing unit 130 can be configured as shown in FIG. 9.

Referring to FIG. 9, similar to that shown in FIG. 7, the write driver 120 includes a first transistor N11 that is connected between a first node K1 and a second node K2 and activated by a write pulse, a second transistor P11 that is diode-connected between a power terminal VDD and the first node K1, and a third transistor P12 that is connected between the power terminal VDD and a memory cell array and activated by the potential applied to the first node K1.

Meanwhile, the comparing unit 130 receives internal data generated by the write control unit 110 and data read from a memory cell, and makes the voltage level of the second node K2 become grounding level VSS, when the input data are the same, and makes the voltage level of the second node K2 be at a high level, when the input data are different.

For this operation, the comparing unit 130 includes a first logic device XOR comparing whether the input data are the same, and a fourth transistor N21 connected between the second node K2 and the grounding terminal VSS and activated in accordance with the output level of the first logic device XOR. In an embodiment of the present invention, the first logic device can perform an exclusive OR calculation and the fourth transistor N21 may be an NMOS transistor.

Therefore, when the input data are not the same, the voltage level of the second node K2 maintains the grounding level, the same as the write driver 120 shown in FIG. 7, such that a corresponding write pulse is applied to a memory cell. On the contrary, when the input data are the same, the voltage level of the second node K2 becomes a high level, such that the write driver 120 does not operate.

As a result, the write operation is performed to only write data different from the data already written, such that it is possible to minimize the amount of current consumed for the write operation.

Figure 10A:
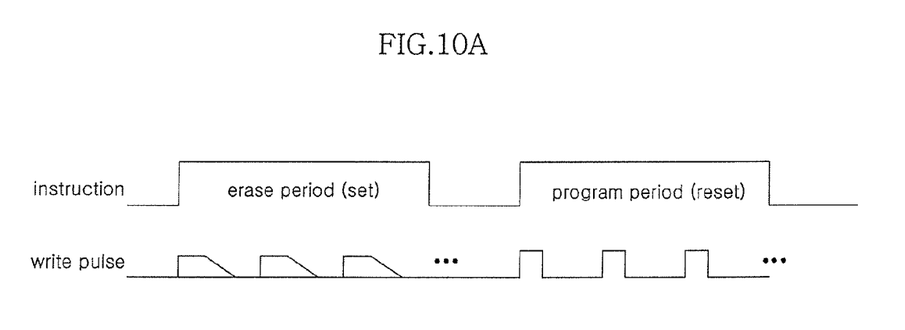
FIG. 10 is a diagram illustrating operational characteristics in accordance with a command in a phase change random access memory apparatus according to an exemplary embodiment.
Figure 10B:
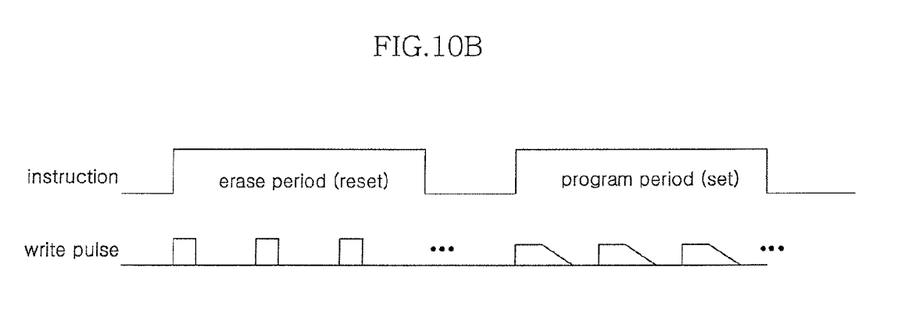

FIGS. 10A and 10B are diagrams illustrating operational characteristics in accordance with a command in a phase change random access memory apparatus according to the present invention.

First, FIG. 10A illustrates when a set operation is performed by an erase command inputted as a first instruction and a reset operation is performed by a program command inputted as a second instruction.

Comparing with FIG. 4, the phase change memory is not in idle mode, but performs a set data write operation, when an erase command is inputted. Accordingly, when a program command is inputted, a reset data write operation that takes a relatively short program time is performed, such that the program period can be considerably reduced, or when the same program time as the related art is given, reset data can be written to more cells.

FIG. 10B illustrates when a reset operation is performed by an erase command inputted as a first instruction and a set operation is performed by a program command inputted as a second instruction.

Since the reset operation takes a shorter time than the set operation, reset data can be written to more cells for the same erase period.

In both embodiments illustrated in FIGS. 10A and 10B, set and reset operations are independently performed, such that it is possible to improve reliability of the cell data. In addition, unlike typical phase change random access memory apparatuses that write set/reset data by one write command, the amount of current consumed by the write (erase, program) operation can be significantly reduced, such that it is possible to cope with the limit in current-drive capability of the phase change random access memory apparatus.

According to the present invention, since the set state and the reset state independently change in a phase change random access memory apparatus, it is possible to reduce the time for performing the programming operation.

Further, when the phase change random access memory apparatus is used in place of a flash memory apparatus, since the set and reset states change in response to an erase command of a flash memory apparatus, it is possible to reduce an unnecessary idle period of the phase change random access memory.

In addition, since the set data write operation and the reset data write operation are performed at different time periods, each cell is under the dame condition in programming, such that it is possible to ensure reliability in data write.

While certain embodiments have been described above, it will be understood that the embodiments described are by way of example only. Accordingly, the apparatus and method described herein should not be limited based on the described embodiments. Rather, the apparatuses and methods described herein should only be limited in light of the claims that follow when taken in conjunction with the above description and accompanying drawings.

What is claimed is:

1. A phase change random access memory apparatus operating by flash memory interface, comprising:
   an instruction-determining unit configured to generate one of an erase command enable signal and a program command enable signal, and internal data, in response to an erase command and a program command, which are inputted from outside, and external data;
   a pulse-generating unit configured to output a write pulse corresponding to the erase command enable signal or the program command enable signal generated by the instruction-determining unit; and
   a write driver configured to write data by applying a current pulse corresponding to a write pulse, which is generated by the pulse-generating unit, to a predetermined phase change memory cell.

2. The phase change random access memory apparatus according to claim 1, wherein the erase command and the program command are sequentially inputted.

3. The phase change random access memory apparatus according to claim 2, wherein the program command is inputted after data is written in accordance with a write pulse corresponding to the erase command.

4. The phase change random access memory apparatus according to claim 1, further comprising a comparing unit configured to activate the write driver, in accordance with whether the internal data is the same as data read out of the predetermined phase change memory cell.

5. The phase change random access memory apparatus according to claim 4, wherein the comparing unit is configured to enable the write driver, when the internal data is the same as data read out of the predetermined phase change memory cell.

6. A phase change random access memory apparatus operating by flash memory interface comprising a plurality of phase change memory cells, wherein the phase change random access memory apparatus is configured to write 'set' data in a predetermined memory cell, in response to an erase command and write 'reset' data in a predetermined memory cell, in response to a program command applied at an independent point of time from the erase command.

7. The phase change random access memory apparatus according to claim 6, wherein the program command is applied after the logic level of the memory cell is completely changed in response to the erase command.

8. The phase change random access memory apparatus according to claim 6, wherein the erase command is applied after the logic level of the memory cell is completely changed in response to the program command.

9. A phase change random access memory apparatus operating by flash memory interface comprising a plurality of phase change memory cells, wherein the phase change random access memory apparatus is configured to write 'reset' data in a predetermined memory cell, in response to an erase command and write 'set' data in a predetermined memory cell, in response to a program command applied at an independent point of time from the erase command.

10. A write control method of a phase change random access memory apparatus operating by flash memory interface, comprising:
    programming 'set' data or 'reset' data to a predetermined phase change memory cell in the phase change random access memory apparatus in response to an erase command; and
    programming 'reset' data or 'set' data to a predetermined phase change memory cell in response to a program command.

11. The write control method according to claim 10, wherein the program command is applied at an independent point of time from the erase command.

12. The write control method according to claim 11, wherein the program command is applied after a program by the erase command is finished.

\* \* \* \* \*